(12) United States Patent
Goyal et al.

(10) Patent No.: US 8,723,582 B1
(45) Date of Patent: May 13, 2014

(54) LEVEL SHIFTER CIRCUIT

(71) Applicants: Gaurav Goyal, Dehradun (IN); Gaurav Gupta, Noida (IN); Bipin B. Malhan, Greater Noida (IN)

(72) Inventors: Gaurav Goyal, Dehradun (IN); Gaurav Gupta, Noida (IN); Bipin B. Malhan, Greater Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/771,025

(22) Filed: Feb. 19, 2013

(51) Int. Cl.
*H03L 5/00* (2006.01)

(52) U.S. Cl.
USPC ............................. 327/333; 326/68; 326/81

(58) Field of Classification Search
USPC ............... 327/112, 333, 427; 326/68, 80, 81; 365/189.11
See application file for complete search history.

(56) References Cited

U.S. PATENT DOCUMENTS

| | | | |
|---|---|---|---|
| 6,428,683 B1 | 8/2002 | Jaworowski |
| 6,429,683 B1 | 8/2002 | Miller |
| 6,954,100 B2 | 10/2005 | Dharne |
| 7,009,424 B2 | 3/2006 | Khan |
| 7,061,299 B2 | 6/2006 | Khan |
| 7,102,410 B2 | 9/2006 | Khan |
| 7,157,970 B2 | 1/2007 | Dawes |
| 7,187,205 B2 | 3/2007 | Ramaraju |
| 7,443,223 B2 | 10/2008 | Bajkowshi |
| 7,446,566 B1 | 11/2008 | Chrudimsky |
| 7,548,093 B1 | 6/2009 | Priel |
| 7,560,970 B2 | 7/2009 | Cook |
| 7,683,668 B1 | 3/2010 | Thakur |
| 7,764,123 B2 | 7/2010 | Kimura |
| 7,777,522 B2 | 8/2010 | Yang |
| 7,808,286 B1 | 10/2010 | Miller |
| 7,816,948 B1 | 10/2010 | Sanchez |
| 7,956,662 B2 | 6/2011 | Arora |
| 8,350,592 B1 * | 1/2013 | Malhan et al. ................. 326/81 |
| 2007/0018931 A1 * | 1/2007 | Park et al. ....................... 345/98 |

OTHER PUBLICATIONS

Bo Zhang, Liping Liang, and Xingjun Wang, "A New Level Shifter with Low Power in Multi-Voltage System," IEEE 8th International Conference on Solid-State and Integrated Circuit Technology, 2006, pp. 1857-1859.

* cited by examiner

*Primary Examiner* — Long Nguyen
(74) *Attorney, Agent, or Firm* — Charles Bergere

(57) ABSTRACT

A single supply level shifter circuit for shifting the voltage level of an input voltage includes a voltage translation stage and a driver stage. The voltage translation stage receives the input voltage and a voltage supply and generates a first voltage. When a magnitude of the input voltage is LOW, the first voltage is LOW. The first voltage is provided to the driver stage, which inverts the first voltage to generate an output voltage that is at a voltage supply (Vdd) level, thereby level shifting the input voltage.

5 Claims, 2 Drawing Sheets

LEVEL SHIFTER CIRCUIT

BACKGROUND OF THE INVENTION

The present invention relates generally to digital electronic circuits, and, more particularly, to a level shifter circuit.

Modern day systems-on-a-chips (SoCs) are designed to consume less power by using lower operating voltages. Multiple voltage domains operating at different voltage supply levels are used to decrease the overall operating voltage of the SoC. These multiple voltage domains require stepping up/down of voltage levels of signals that cross different voltage domains. Level shifter circuits are used to step up/down the logic signal level as it enters a different voltage level domain.

Conventional level shifter circuits operate by using at least two voltage supplies to step up/down the voltage level of the input signal. The two voltage supplies include high and low voltage supplies that correspond to the voltage supply levels of the domains between which the signal traverses. The two voltage supplies require two separate routing tracks for each row of standard cells in the SoC design. Since the circuit densities of SoCs are continually rising, placement and routing of standard cells is becoming increasingly onerous. The requirement of additional routing tracks to route the two voltage supplies for the level shifter circuits adds to placement and routing complexities and leads to congestion in functional nets. To overcome the above-mentioned difficulties, level shifters that use a single voltage supply have been designed.

FIG. 1 shows a schematic circuit diagram of a conventional level shifter circuit 100 that operates using a single voltage supply. The level shifter circuit 100 includes six transistors (first through sixth) 102-112.

Source and gate terminals of the first transistor 102 are connected to a voltage supply ($V_{ddh}$). A source terminal of the second transistor 104 is connected to the voltage supply $V_{ddh}$. A drain terminal of the second transistor 104 is connected to drain and source terminals of the first and third transistors 102 and 106, respectively. A gate terminal of the third transistor 106 receives an input voltage ($V_{in}$). A drain terminal of the fourth transistor 108 is connected to a drain terminal of the third transistor 106, a gate terminal of the fourth transistor 108 is connected to the gate terminal of the third transistor 106 for receiving the input voltage $V_{in}$, and a source terminal of the fourth transistor 108 is connected to ground. Further, a source terminal of the fifth transistor 110 is connected to the voltage supply $V_{ddh}$, and a gate terminal thereof is connected to the drain terminals of the third and fourth transistors 106 and 108. A drain terminal of the sixth transistor 112 is connected to a drain terminal of the fifth transistor 110, a gate terminal of the sixth transistor 112 is connected to the gate terminal of the fifth transistor 110, and a source terminal of the sixth transistor 112 is connected to ground. The drain terminals of the fifth and sixth transistors 110 and 112 are connected to a gate terminal of the second transistor 104. An output voltage $V_{out}$ is generated at the drain terminals of the fifth and sixth transistors 110 and 112.

A voltage at the source terminal of the third transistor 106 is dynamically changed based on the input voltage $V_{in}$ using the second transistor 104, thereby generating the output voltage $V_{out}$ that is a level-shifted form of the input voltage $V_{in}$. For example, when the input voltage $V_{in}$ is HIGH (i.e., 1.8V), the third transistor is switched off. The successive inverters formed by the third and fourth transistors 106 and 108 and fifth and sixth inverters 110 and 112 invert the input voltage $V_{in}$ twice leading to the output voltage $V_{out}$ becoming HIGH. The output voltage $V_{out}$ is provided at the gate terminal of the second transistor 104 that is switched off by the output voltage $V_{out}$ being HIGH. Since the first transistor 102 is a diode-connected transistor, a voltage at its drain terminal is $V_{ddh}-V_t$ ($V_t$ is the threshold voltage drop of the first transistor 102).

When the input voltage $V_{in}$ is LOW (i.e., ~1.0V), the output voltage $V_{out}$ remains LOW. The LOW output voltage $V_{out}$ switches on the second transistor 104, which pulls up the voltage at the gate terminal thereof and at the source terminal of the third transistor 106 to $V_{ddh}$. Thus, the voltage at the source terminal of the third transistor 106 is dynamically switched between $V_{ddh}-V_t$ and $V_{ddh}$ leading to the generation of the output voltage $V_{out}$ that is a level-shifted form of the input voltage $V_{in}$.

Since the level shifter circuit 100 operates with just one voltage supply, it overcomes limitations associated with dual voltage supply level shifters. However, the level shifter circuit 100 still suffers from several disadvantages. For example, if the difference between ($V_{ddh}-V_t$) and the input voltage $V_{in}$ is more than $V_t$, then a leakage current is generated. If the input voltage $V_{in}=0.75V$, the voltage supply $V_{ddh}=1.42V$, and the threshold voltage $V_t=0.28V$, then since $V_{ddh}-V_t=1.14V$ and $V_{ddh}-V_t-V_{in}=0.39V$ (which is greater than $V_t=0.28V$), a high leakage currents flow through the first, third, and fourth transistors 102, 106 and 108, which deteriorates the functionality of the convention level shifter circuit 100 and limit its use in applications having broad input and output voltage ranges. Additionally, the first transistor 102 is a diode-connected transistor, which limits the operating speed of the conventional level shifter circuit 100.

Therefore, it would be advantageous to have a level shifter circuit that uses a single voltage supply, that has a fast operating speed and reduced leakage currents, and that overcomes the above-mentioned limitations of the conventional level shifter circuits.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

Figure 1:
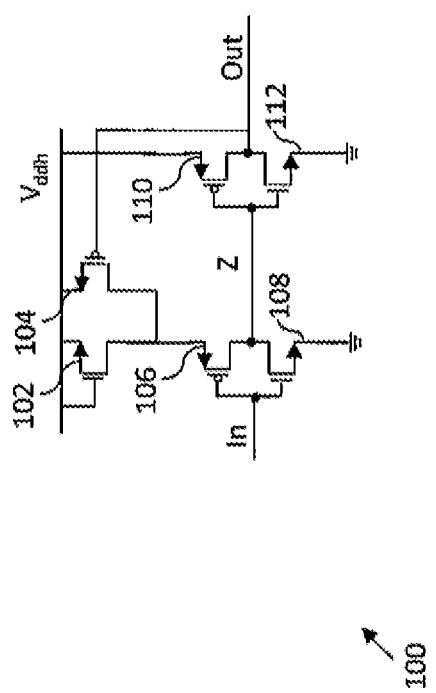
FIG. 1 is a schematic circuit diagram of a conventional level shifter circuit.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a level shifter circuit is provided. The level shifter circuit generates an output voltage based on an input voltage and includes a voltage translation stage for receiving the input voltage. The voltage translation stage includes: a first transistor having a source terminal for receiving a voltage supply; a second transistor having a drain terminal connected to a drain terminal of the first transistor, a gate terminal for receiving the input voltage, and a source terminal connected to ground; a third transistor having a source terminal for receiving the voltage supply, and a gate terminal connected to the drain terminals of the first and second transistors; and a fourth transistor having a drain terminal connected to a drain terminal of the third transistor and a gate terminal of the first transistor, and a source terminal connected to ground. The level shifter circuit further includes a driver stage connected to the voltage translation stage for generating the output voltage, and a comparison stage, connected to the voltage translation stage. The comparison stage includes: a fifth transistor having a source terminal connected to the drain terminals of the first and second transistors, and a drain terminal connected to a gate terminal of the fourth transistor; a sixth transistor having a drain terminal connected to the source terminal of the fifth transistor, a gate terminal for receiving the input voltage, and a source terminal connected to the drain terminal of the fifth transistor; a seventh transistor having a source terminal connected to the drain terminals of the third and fourth transistors, a drain terminal connected to the drain and source terminals of the fifth and sixth transistors, respectively, and a gate terminal connected to the gate terminal of the sixth transistor for receiving the input voltage; and an eighth transistor having a drain terminal connected to the source terminal of the seventh transistor, a gate terminal connected to a gate terminal of the fifth transistor and the drain terminals of the first and second transistors, and a source terminal connected to the drain terminal of the seventh transistor.

In another embodiment of the present invention, a level shifter circuit is provided. The level shifter circuit generates an output voltage based on an input voltage and includes a voltage translation stage for receiving the input voltage. The voltage translation stage includes: a first transistor having a source terminal for receiving a voltage supply; a second transistor having a drain terminal connected to a drain terminal of the first transistor, a gate terminal for receiving the input voltage, and a source terminal connected to ground; a third transistor having a source terminal for receiving the voltage supply, and a gate terminal connected to the drain terminals of the first and second transistors; and a fourth transistor having a drain terminal connected to a drain terminal of the third transistor and a gate terminal of the first transistor, and a source terminal connected to ground. The level shifter circuit further includes a driver stage connected to the voltage translation stage for generating the output voltage. The driver stage includes: a fourth transistor having a gate terminal connected to the drain terminals of the first and second transistors, and a source terminal for receiving the voltage supply; and a fifth transistor having a drain terminal connected to a drain terminal of the ninth transistor, a gate terminal connected to the gate terminal of the ninth transistor, and a source terminal connected to ground. The output voltage is generated at the drain terminals of the ninth and tenth transistors. The level shifter circuit includes a comparison stage connected to the voltage translation stage. The comparison stage includes: a seventh transistor having a source terminal connected to the drain terminals of the first and second transistors, and a drain terminal connected to a gate terminal of the fourth transistor; an eighth transistor having a drain terminal connected to the source terminal of the seventh transistor, a gate terminal for receiving the input voltage, and a source terminal connected to the drain terminal of the seventh transistor; a ninth transistor having a source terminal connected to the drain terminals of the third and fourth transistors, a drain terminal connected to the drain and source terminals of the seventh and eighth transistors, respectively, and a gate terminal connected to the gate terminal of the eighth transistor for receiving the input voltage; and a tenth transistor having a drain terminal connected to the source terminal of the ninth transistor, a gate terminal connected to a gate terminal of the seventh transistor and the drain terminals of the first and second transistors, and a source terminal connected to the drain terminal of the ninth transistor.

Various embodiments of the present invention provide a level shifter circuit that includes voltage translation and driver stages. The voltage translation stage receives an input voltage and a voltage supply and generates a first voltage. When the input voltage is at LOW potential, the first voltage is at ground. The first voltage is provided to the driver stage that inverts the first voltage to generate an output voltage that is equal to voltage supply Vdd, thereby level shifting the input voltage. Since the level shifter circuit requires single voltage supply for operation, no extra power routing resources corresponding to a second voltage supply are required as are required in conventional dual-supply level shifter circuits. The free routing resources may be used for routing functional nets, relieve congestion, and eliminate the need for a larger die area. Thus, the overall cost of the end product is reduced. Further, the physical placement restrictions associated with conventional dual-supply level shifter circuits that force them to be placed at boundary of high and low-voltage domains are also eliminated by the level shifter circuit that requires single voltage supply for operation. Further, the level shifter circuit has a leakage current that is considerably less compared with the conventional level shifter circuit. Additionally, the level shifter circuit is capable of operating at high speed.

Figure 2:
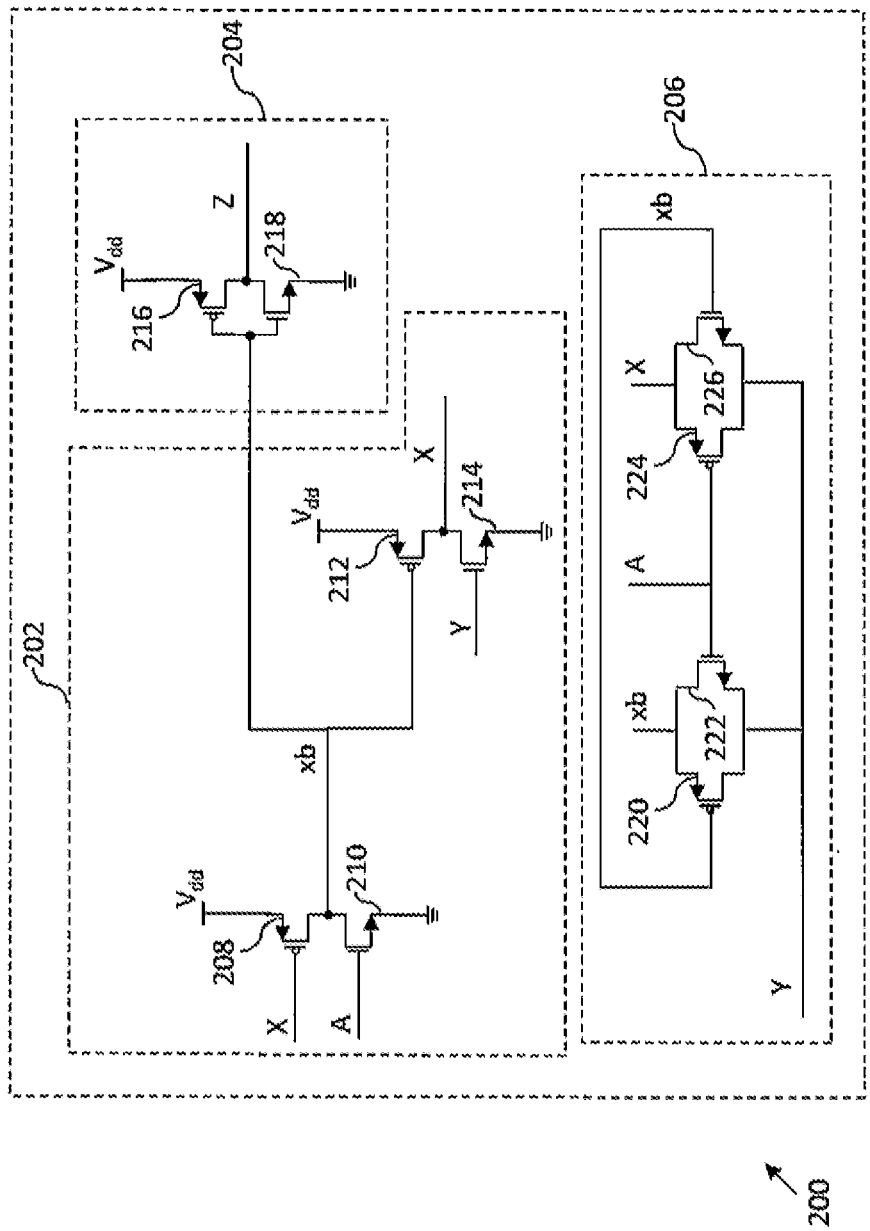
FIG. 2 is a schematic circuit diagram of a level shifter circuit in accordance with an embodiment of the present invention.

Referring now to FIG. 2, a schematic circuit diagram of a level shifter circuit 200 in accordance with an embodiment of the present invention is shown. The level shifter circuit 200 includes a voltage translation stage 202, a driver stage 204, and a comparison stage 206. The voltage translation stage 202 includes four transistors (first through fourth) 208-214, the driver stage 204 includes two transistors (fifth and sixth) 216 and 218, and the comparison stage 206 includes four transistors (seventh through tenth) 220-226.

A source terminal of the first transistor 208 is connected to a voltage supply $V_{dd}$. A drain terminal of the second transistor 210 is connected to a drain terminal of the first transistor 208, a gate terminal of the second transistor 210 receives an input voltage (A), and a source terminal of the second transistor 210 is connected to ground. A source terminal of the third transistor 212 is connected to the voltage supply $V_{dd}$ and a gate terminal thereof is connected to the drain terminals of the first and second transistors 208 and 210. A drain terminal of the fourth transistor 214 is connected to a drain terminal of the third transistor 212 and a source terminal of the fourth transistor 214 is connected to ground.

A source terminal of the fifth transistor 216 is connected to the voltage supply $V_{dd}$ and a gate terminal thereof is connected to the drain terminals of the first and second transistors 208 and 210. A drain terminal of the sixth transistor 218 is connected to a drain terminal of the fifth transistor 216, a gate terminal of the sixth transistor 218 is connected to the gate terminal of the fifth transistor 216, and a source terminal of the sixth transistor 218 is connected to ground.

A source terminal of the seventh transistor 220 is connected to the drain terminals of the first and second transistors 208 and 210, and a drain terminal of the seventh transistor 220 is connected to a gate terminal of the fourth transistor 214. A drain terminal of the eighth transistor 222 is connected to the drain terminals of the first and second transistors 208 and 210, a gate terminal of the eighth transistor 222 is receives the input voltage A, and a source terminal of the eighth transistor 222 is connected to the gate and drain terminals of the fourth and seventh transistors 214 and 220, respectively. A source terminal of the ninth transistor 224 is connected to a gate terminal of the first transistor 208, a gate terminal of the ninth transistor 224 receives the input voltage A, and a drain terminal of the ninth transistor 224 is connected to the gate terminal of the fourth transistor 214. A drain terminal of the tenth transistor 226 is connected to the drain terminals of the first and second transistors 208 and 210, a gate terminal of the tenth transistor 226 is connected to a gate terminal of the seventh transistor 220 and the drain terminals of the first and second transistors 208 and 210, and a source terminal of the tenth transistor 226 is connected to the gate terminal of the fourth transistor 214.

In an example, when the input voltage A is HIGH (i.e., 0.9V), the second transistor 210 is switched on and pulls down a voltage at the drain terminals of the first and second transistors 208 and 210 (i.e, voltage xb) to ground. As a result, the third and fifth transistor 212 and 216 are switched on and voltages at the drain terminals of the third and fifth transistors 212 and 216 (i.e., voltages X and Z, respectively) are pulled up to the voltage supply $V_{dd}$ level. Since the voltage supply $V_{dd}$ received by the fifth transistor 216 is at a higher potential, viz., 1.42V, compared with the input voltage A that is at 0.9V, the pulling up of the drain terminal of the fifth transistor 216 to the voltage supply $V_{dd}$ level shifts up the level of the input voltage A.

Since the voltage at the drain terminal of the third transistor 212, which has been pulled up, is provided to the gate terminal of the first transistor 208, the first transistor 208 continues to remain switched off. The input voltage A is provided at the gate terminal of the ninth transistor 224 and the source terminal thereof receives the voltage X. Since the input voltage A is less than the voltage supply $V_{dd}$, the source terminal of the ninth transistor 224 is at a higher voltage compared with the gate terminal thereof. Therefore, the ninth transistor 224 does not switch off completely and stays in a partially switched on state which leads to a voltage at the drain terminal of the ninth transistor 224 (i.e., the voltage Y) to be pulled up to voltage supply $V_{dd}$ level. As the seventh and eighth transistors 220 and 222 are on, the voltage at the drain and source terminals of the seventh and eighth transistors 220 and 222 (i.e., the voltage Y), respectively, is pulled down simultaneously with the voltage Y being pulled up by the ninth transistor 224. The seventh and eighth transistors 220 and 222 are completely switched on and fully conducting as compared to the ninth transistor 224 which is partially switched on and hence the voltage Y is pulled down to ground.

Since the voltage Y is provided at the gate terminal of the fourth transistor 214, the fourth transistor 214 remains switched off, thereby preventing leakage through third and fourth transistors 212 and 214. Thus, an output voltage Z generated at the drain terminals of the fifth and sixth transistors 216 and 218 transitions to voltage supply $V_{dd}$ level.

In another example, the input voltage A transitions to LOW state (i.e., ~0V). Since the voltage xb does not instantaneously transition to voltage supply $V_{dd}$ level, it stays at ground from a previous cycle. Thus, the input voltage A and the voltage xb remain equal for a predefined time. Additionally, the voltage at the drain terminals of the third and fourth transistors 212 and 214 (i.e., the voltage X) also remains at voltage supply $V_{dd}$ level during this predefined time. Since the input voltage A transitions to LOW state, the voltage X is at voltage supply $V_{dd}$ level, and the voltage xb is at ground, the ninth transistor 224 is switched on and the seventh and tenth transistors 222 and 226 are switched off which pulls up the voltage at the drain terminal thereof (i.e., voltage Y) to voltage supply $V_{dd}$ level. Since the voltage Y is provided at the gate terminal of the fourth transistor 214, the voltage at the drain terminal thereof (i.e., the voltage X) is pulled down to ground. Since the voltage X is provided at the gate terminal of the first transistor 208, pulling down of the voltage X to ground switches on the first transistor 208. The switching on of the first transistor 208 pulls up the voltage xb to voltage supply $V_{dd}$ level which in turn pulls down the voltage Z to ground. The voltage Y remains at voltage supply $V_{dd}$ level for a predefined time when the voltage xb and the input voltage A are not equal. Further, when the voltage xb transitions to voltage supply $V_{dd}$ level, the voltages Y and X remain at ground. Thus, the voltage Z generated at the drain terminals of the fifth and sixth transistors 216 and 218 transitions to ground when the input voltage A transitions to LOW state without any leakage current.

In an embodiment of the present invention, the first, third, fifth, seventh, and ninth transistors 208, 212, 216, 220, and 224 are p-channel metal-oxide semiconductor (PMOS) transistors and the second, fourth, sixth, eighth, and tenth transistors 210, 214, 218, 222, AND 226 are n-channel metal-oxide semiconductor (NMOS) transistors.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:
1. A level shifter circuit for generating an output voltage based on an input voltage, comprising:
   a voltage translation stage for receiving the input voltage, comprising:
      a first transistor having a source terminal for receiving a voltage supply;
      a second transistor having a drain terminal connected to a drain terminal of the first transistor, a gate terminal for receiving the input voltage, and a source terminal connected to ground;
      a third transistor having a source terminal for receiving the voltage supply, and a gate terminal connected to the drain terminals of the first and second transistors; and
      a fourth transistor having a drain terminal connected to a drain terminal of the third transistor and a gate terminal of the first transistor, and a source terminal connected to ground;
   a driver stage connected to the voltage translation stage for generating the output voltage; and
   a comparison stage, connected to the voltage translation stage, comprising:
      a fifth transistor having a source terminal connected to the drain terminals of the first and second transistors, and a drain terminal connected to a gate terminal of the fourth transistor;
      a sixth transistor having a drain terminal connected to the source terminal of the fifth transistor, a gate terminal for receiving the input voltage, and a source terminal connected to the drain terminal of the fifth transistor;
      a seventh transistor having a source terminal connected to the drain terminals of the third and fourth transistors, a drain terminal connected to the drain and source terminals of the fifth and sixth transistors, respectively, and a gate terminal connected to the gate terminal of the sixth transistor for receiving the input voltage; and an eighth transistor having a drain terminal connected to the source terminal of the seventh transistor, a gate terminal connected to a gate terminal of the fifth transistor and the drain terminals of the first and second transistors, and a source terminal connected to the drain terminal of the seventh transistor.

2. The level shifter circuit of claim 1, wherein the driver stage includes:

a ninth transistor having a gate terminal connected to the drain terminals of the first and second transistors, and a source terminal for receiving the voltage supply; and a tenth transistor having a drain terminal connected to a drain terminal of the ninth transistor, a gate terminal connected to the gate terminal of the ninth transistor, and a source terminal connected to ground, wherein the output voltage is generated at the drain terminals of the ninth and tenth transistors.

3. The level shifter circuit of claim 2, wherein the first, third, fifth, seventh, and ninth transistors are p-channel metal-oxide semiconductor (PMOS) transistors.

4. The level shifter circuit of claim 3, wherein the second, fourth, sixth, eighth, and tenth transistors are n-channel metal-oxide semiconductor (NMOS) transistors.

5. A level shifter circuit for generating an output voltage based on an input voltage, comprising:

a voltage translation stage for receiving the input voltage, comprising:

a first transistor having a source terminal for receiving a voltage supply;

a second transistor having a drain terminal connected to a drain terminal of the first transistor, a gate terminal for receiving the input voltage, and a source terminal connected to ground;

a third transistor having a source terminal for receiving the first voltage supply, and a gate terminal connected to the drain terminals of the first and second transistors; and a fourth transistor having a drain terminal connected to a drain terminal of the third transistor and a gate terminal of the first transistor, and a source terminal connected to ground;

a driver stage connected to the voltage translation stage for generating the output voltage, comprising:

a fifth transistor having a gate terminal connected to the drain terminals of the first and second transistors, a source terminal for receiving the voltage supply; and a sixth transistor having a drain terminal connected to a drain terminal of the fifth transistor, a gate terminal connected to the gate terminal of the fifth transistor, and a source terminal connected to ground, wherein the output voltage is generated at the drain terminals of the fifth and sixth transistors; and a comparison stage, connected to the voltage translation stage, comprising:

a seventh transistor having a source terminal connected to the drain terminals of the first and second transistors, and a drain terminal connected to a gate terminal of the fourth transistor;

an eighth transistor having a drain terminal connected to the source terminal of the seventh transistor, a gate terminal for receiving the input voltage, and a source terminal connected to the drain terminal of the seventh transistor;

a ninth transistor having a source terminal connected to the drain terminals of the third and fourth transistors, a drain terminal connected to the drain and source terminals of the seventh and eighth transistors, respectively, and a gate terminal connected to the gate terminal of the eighth transistor for receiving the input voltage; and a tenth transistor having a drain terminal connected to the source terminal of the ninth transistor, a gate terminal connected to the gate terminal of the seventh transistor and the drain terminals of the first and second transistors, and a source terminal connected to the drain terminal of the ninth transistor.

\* \* \* \* \*